(12) United States Patent
Zhu et al.

(10) Patent No.: US 6,936,524 B2
(45) Date of Patent: Aug. 30, 2005

(54) ULTRATHIN FORM FACTOR MEMS MICROPHONES AND MICROSPEAKERS

(75) Inventors: Xu Zhu, Pittsburgh, PA (US); Raymond A. Ciferno, Cranberry Township, PA (US)

(73) Assignee: Akustica, Inc., Pittsburgh, PA (US)

( * ) Notice: Subject to any disclaimer, the term of this patent is extended or adjusted under 35 U.S.C. 154(b) by 0 days.

(21) Appl. No.: 10/701,860

(22) Filed: Nov. 5, 2003

(65) Prior Publication Data

US 2005/0095813 A1 May 5, 2005

(51) Int. Cl.⁷ .......................................... H01L 21/46
(52) U.S. Cl. ..................... 438/459; 438/455; 438/50; 438/52; 438/53; 438/48; 438/464; 438/977
(58) Field of Search ................ 438/459, 455, 438/50, 53, 52, 48, 464, 977

(56) References Cited

U.S. PATENT DOCUMENTS

| | | | |
|---|---|---|---|
| 5,658,710 | A | 8/1997 | Neukermans |
| 5,717,631 | A | 2/1998 | Carley et al. |
| 5,970,315 | A | 10/1999 | Carley et al. |
| 6,100,477 | A | 8/2000 | Randall et al. |
| 6,262,946 | B1 | 7/2001 | Khuri-Yakub et al. |
| 6,440,820 | B1 * | 8/2002 | Lee et al. ............... 438/459 |
| 6,548,327 | B2 * | 4/2003 | De Pauw et al. ........ 438/118 |
| 6,603,191 | B2 * | 8/2003 | Wakabayashi et al. ... 257/620 |
| 6,688,169 | B2 * | 2/2004 | Choe et al. ............. 73/170.13 |
| 6,732,588 | B1 * | 5/2004 | Mullenborn et al. ...... 73/715 |
| 2003/0133588 | A1 * | 7/2003 | Pedersen ............... 381/423 |
| 2003/0146681 | A1 * | 8/2003 | Hwu et al. ............. 313/293 |
| 2003/0199116 | A1 * | 10/2003 | Tai et al. ............... 438/53 |
| 2003/0210300 | A1 * | 11/2003 | Silverbrook ............ 347/54 |
| 2003/0210799 | A1 * | 11/2003 | Gabriel et al. .......... 381/173 |
| 2004/0145056 | A1 * | 7/2004 | Gabriel et al. .......... 257/758 |

FOREIGN PATENT DOCUMENTS

| | | |
|---|---|---|
| WO | WO 93/19343 | 9/1993 |
| WO | WO 94/30030 | 12/1994 |
| WO | WO 01/20948 A2 | 3/2001 |

OTHER PUBLICATIONS

Kaigham H. Gabriel, Xu Zhu, U.S. Appl. No. 10/349,618, filed Jan. 23, 2003.

(Continued)

*Primary Examiner*—B. William Baumeister
*Assistant Examiner*—Igwe U. Anya
(74) *Attorney, Agent, or Firm*—Thorp Reed & Armstrong, LLP

(57) ABSTRACT

A process comprises reducing the thickness of a substrate carrying a plurality of devices, with at least certain of the devices having a micro-machined mesh. A carrier wafer is attached to the back side of the substrate and the fabrication of the devices is completed from the top side of the substrate. Thereafter the plurality of devices is singulated. Various alternative embodiments are disclosed which demonstrate that the thinning of the wafer may occur at different times during the process of fabricating the MEMS devices such as before the mesh is formed or after the mesh is formed. Additionally, the use of carrier wafers to support the thinned wafer enables process steps to be carried out on the side opposite from the side having the carrier wafer. The various alternative embodiments demonstrate that the side carrying the carrier wafer can be varied throughout the process.

28 Claims, 16 Drawing Sheets

OTHER PUBLICATIONS

Michael Pedersen, Wouter Olthuis and Piet Bergveld, A Silicon Condenser Microphone with Polyimide Diaphragm and Backplate, Sensors and Actuators A, Elsevier Science, Mar. 2, 1997, pp. 97-104.

John J. Neumann, Jr. and Kaigham J. Gabriel, CMOS-MEMS Membrane for Audio-Frequency Acoustic Acuation, Electrical and Computer Engineering Dept., Carnegie Mellon University, 2001, pp. 236-239, XP-002240602.

* cited by examiner

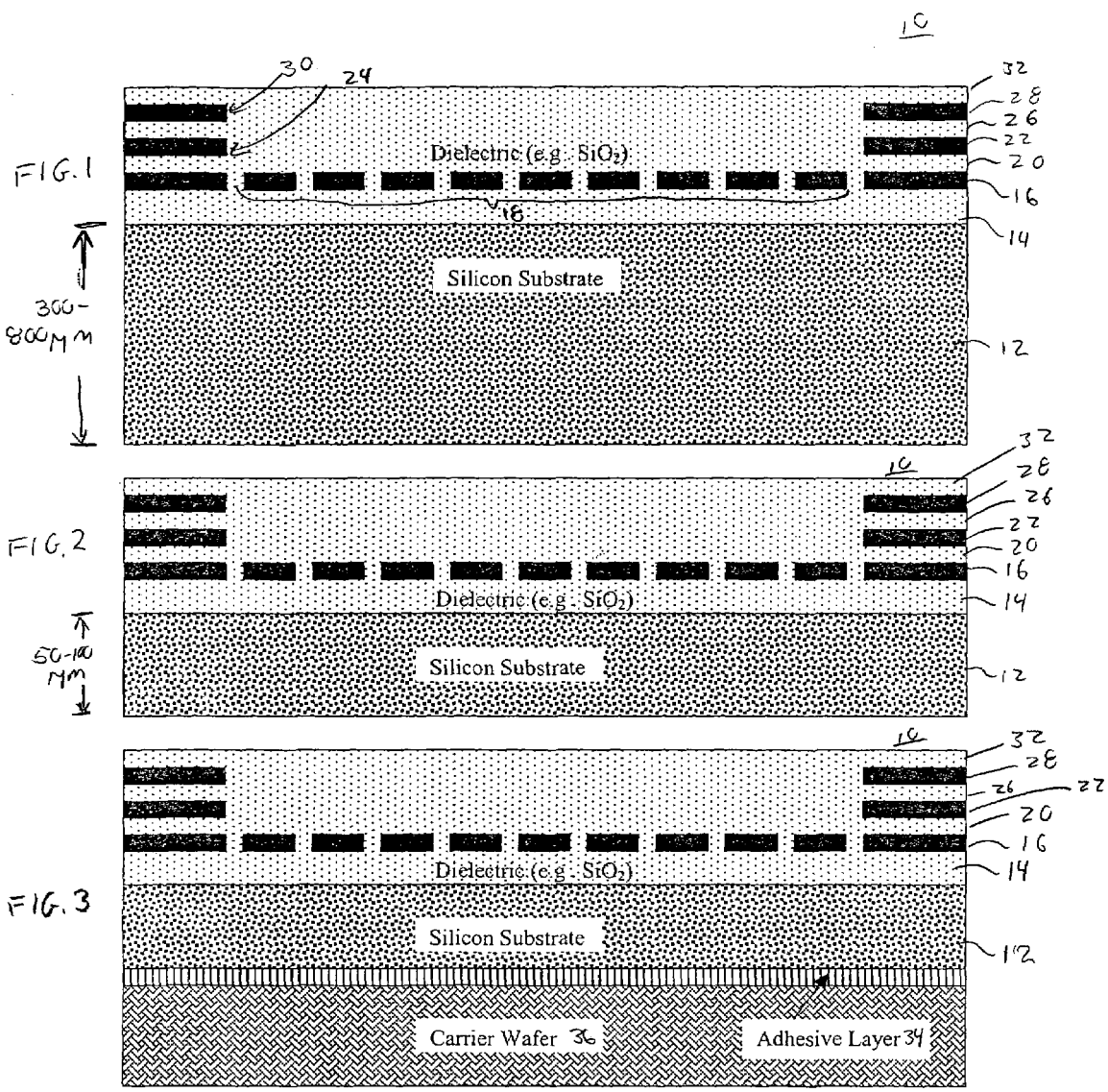

ULTRATHIN FORM FACTOR MEMS MICROPHONES AND MICROSPEAKERS

BACKGROUND

The present disclosure is directed generally to micro-electro-mechanical systems (MEMS) devices and, more particularly, to processing techniques for forming ultrathin devices.

The ability to form moving parts measured in microns has opened up a huge range of applications. Such moving parts typically take the form of a beam or mesh that may form, for example, a variable capacitor, switch, or other component. The recent ability to seal micro-machined meshes has lead to the fabrication of microphones and microspeakers. See, for example, International Publication No. WO/01/20948 A2 published 22 Mar. 2001, entitled MEMS Digital-to-Acoustic Transducer With Error Cancellation, the entirety of which is hereby incorporated by reference.

A sealed mesh can function as a movable plate of a variable capacitor, and therefore can operate as a microspeaker or microphone. For a sealed mesh to operate as a microspeaker or microphone, the device needs to be able to push air to create a soundwave just as its larger counterparts must push air to create soundwaves. For example, traditional speaker enclosures have a port on the back to allow the speaker to move freely. In the case of a microspeaker or microphone, if the chamber beneath the sealed mesh does not have a vent or other opening to ambient, movement of the sealed mesh inward is inhibited by the inability to compress the air in the chamber while movement of the mesh outward is inhibited by formation of a vacuum. Thus it is necessary to form a vent in the chamber.

Currently, such vents are formed by boring through the substrate from the rear. That requires patterning the back side of the substrate followed by an etch through the entirety of the substrate to reach the chamber. Forming of vents by this technique is slow in that several hundred microns of substrate may need to be etched to reach the chamber beneath the sealed mesh and the diameter of the vent is small compared to its depth. Additionally, there are registration problems in that it is necessary to work from the back side of the substrate where there are no landmarks, and hundreds of microns may need to be etched to reach a chamber that may measure in the tens of microns.

U.S. patent application Ser. No. 10/349,618 entitled Process for Forming and Acoustically Connecting Structures on a Substrate, filed Jan. 23, 2003 discloses a processes in which the substrate is etched in the area of the mesh. Although that represents an improvement over the prior art, the need still exists for an easy, repeatable, fast process for forming vents in the chambers of sealed meshes that are to function as speakers or microphones.

BRIEF SUMMARY

The present disclosure contemplates a process comprising reducing the thickness of a substrate carrying a plurality of devices, with at least certain of the devices having a micro-machined mesh. A carrier wafer is attached to the back side of the substrate and the fabrication of the devices is completed from the top side of the substrate. Thereafter the plurality of devices is singulated.

The present disclosure also contemplates a process comprising reducing the thickness of a substrate carrying a plurality of devices, with at least certain of the devices having a micro-machined mesh. A first carrier wafer is attached to the back side of the substrate. The mesh is formed and released. A second carrier wafer is attached to the top side of the substrate and the first carrier wafer is removed from the back side of the substrate. Vent holes are formed from the back of the substrate. Thereafter, the plurality of devices is singulated.

The present disclosure also contemplates a process comprising reducing the thickness of a substrate carrying a plurality of devices, with at least certain of the devices having a micro-machined mesh. A first carrier wafer is attached to the back side of the substrate. The mesh is formed but not yet released. A second carrier wafer is attached to the top side of the substrate and the first carrier wafer is removed from the back side of the substrate. Vent holes are formed from the back of the substrate. A third carrier wafer is attached to the back side of the substrate and the second carrier wafer is removed from the top side of the substrate. The mesh is released and the plurality of devices is singulated.

The present disclosure also contemplates a process comprising reducing the thickness of a substrate carrying a plurality of devices, with at least certain of the devices having a micro-machined mesh. A first carrier wafer is attached to the back side of the substrate. A resist is patterned to define a mesh. A second carrier wafer is attached to the top side of the substrate and the first carrier wafer is removed from the back side of the substrate. Vent holes are formed from the back of the substrate. A third carrier wafer is attached to the back side of the substrate and the second carrier wafer is removed from the top side of the substrate. The mesh is formed and released. Thereafter, the plurality of devices is singulated.

As the various embodiments of the disclosure indicate, the thinning of the wafer may occur at different times during the process of fabricating a MEMS device such as before the mesh is formed or after the mesh is formed. Additionally, the use of carrier wafers to support the thinned wafer enables process steps to be carried out on the side opposite from the side having the carrier wafer. As the different embodiments indicate, the side carrying the carrier wafer can be varied throughout the process. Those advantages and benefits, and others, will be apparent from the description appearing below.

BRIEF DESCRIPTION OF THE DRAWINGS

For the present disclosure to be easily understood and readily practiced, the present disclosure will now be described, for purposes of illustration and not limitation, in conjunction with the following figures, wherein:

FIG. 1 illustrates a substrate having a plurality of metal layers patterned to form a device;

FIG. 2 illustrates the substrate of FIG. 1 after the thickness of the substrate has been reduced;

FIG. 3 illustrates the substrate of FIG. 2 after a carrier wafer has been attached to the back side of the substrate;

DETAILED DESCRIPTION

Figure 4:
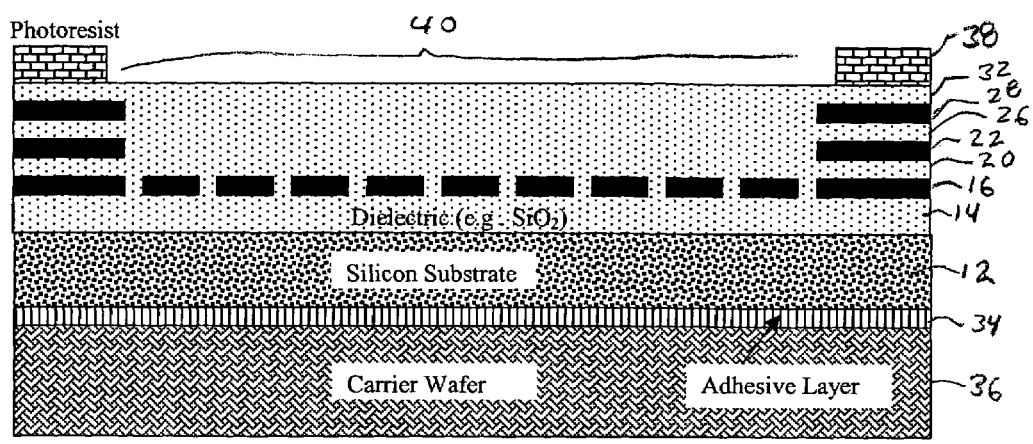
FIG. 4 illustrates the substrate of FIG. 3 after the top side has been patterned with a resist.

A first embodiment of the present disclosure is illustrated in conjunction with FIGS. 1–9. In FIG. 1, a wafer 10 (a portion of which is seen in FIG. 1) is received from a CMOS foundry. Those of ordinary skill in the art will recognize the wafer carries a plurality of devices, one of which is shown in FIG. 1. At the CMOS foundry, a silicon substrate 12 has been processed so as to form alternating layers of, for example, a dielectric material and a metal. The wafer 10 illustrated in FIG. 1 has a first layer of dielectric material 14 carrying a first metal layer 16. The first metal layer 16 has been patterned such that a portion thereof forms a micromachined mesh 18. Formed on the first metal layer 16 is a second layer of dielectric 20. The second layer of dielectric 20 carries a second metal layer 22 which has been patterned to have an opening 24 formed therein. The second metal layer 22 carries a third layer of dielectric 26. The third layer of dielectric 26 carries a third layer of metal 28 which has been patterned to have an opening 30 formed therein. A top layer of dielectric 32 is formed on top of the third metal layer 28.

The present disclosure is not limited to the position and configuration of the metal layers shown in the figures. For example, the pattern shown in FIG. 1 could be implemented in metal layers two, three and four such that references herein to a first, second and third layers of metal need not correspond to metal layers one, two and three, respectively. Additionally, the configuration of the layers of metal need not be as shown in the figures but rather may vary depending upon the device to be fabricated.

As previously mentioned, the wafer 10 would be received, for example, as shown in FIG. 1 from the CMOS foundry. Thereafter, the wafer 10 will be subjected to post-processing fabrication steps. Although it is anticipated that the post-processing fabrication steps will take place in a facility different from the CMOS foundry which fabricated the wafer 10, that is not a requirement of the present disclosure.

Turning to FIG. 2, a CMP process, back side grinding, a reactive ion etch (RIE) a dry, reactive ion etch (DRIE) or other process is performed on the back side of the wafer 10 to thin the wafer to 50–100 $\mu$m. Depending on the process selected for thinning the wafer, it may necessary to take steps to protect the top side of the wafer.

Turning to FIG. 3, a layer of adhesive 34 is used to attach a first carrier wafer 36 to the back side of the substrate 14. Openings (not shown) may be provided in the carrier wafer 36 and/or adhesive layer 34 to provide for cooling of the substrate 12. Additionally, those of ordinary skill in the art will recognize that, depending on the amount of substrate 14 being removed and the process being performed, it may be necessary to attach a temporary carrier wafer (not shown) to the top side of wafer 10 to provide support for the thinning process. If such a temporary support is needed, it is removed after first carrier wafer 36 is attached as shown in FIG. 3.

Figure 5:
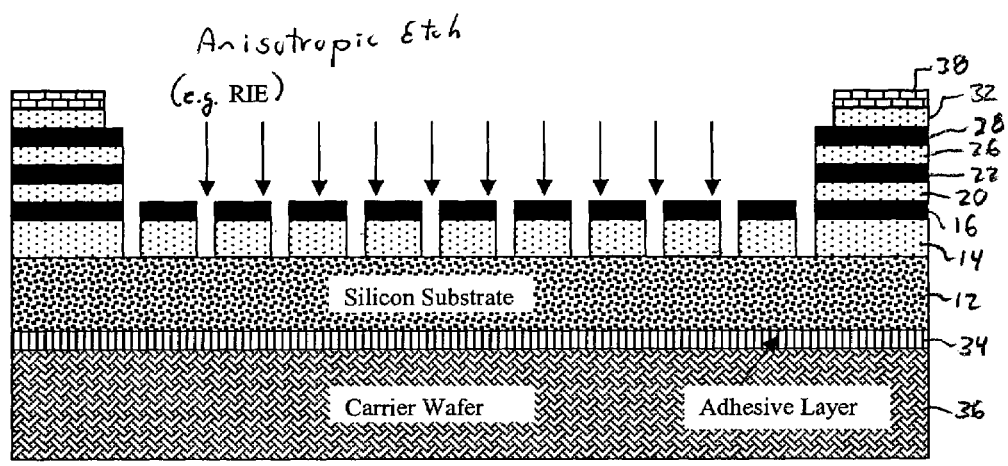
FIG. 5 illustrates the fabrication of the mesh as a result of an anisotropic etch.

FIG. 4 illustrates the substrate 12 of FIG. 3 after a layer of resist 38 is formed (by any appropriate process) on the top side and patterned (by any appropriate process) to provide an opening 40 in the area of the mesh 18. In FIG. 5, the substrate 12 of FIG. 4 is illustrated being subjected to an anisotropic through the dielectric layers 32, 26, 20 and 14 to form the mesh. The patterned resist 38 and the first metal layer 16 are used to pattern the first dielectric layer 14. The layer of resist 38 may not be necessary if it is not necessary to protect the top layer of dielectric 32.

Figure 6:
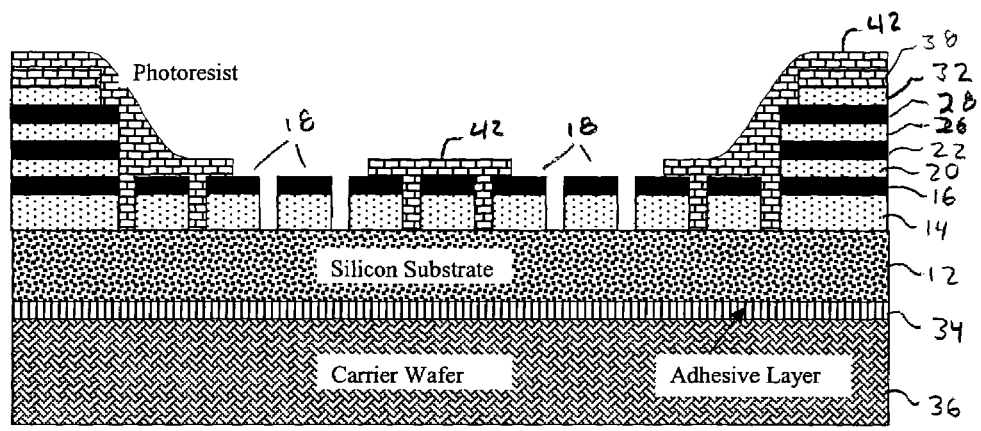
FIG. 6 illustrates the substrate of FIG. 5 after the top side has been patterned with a resist.
Figure 7:
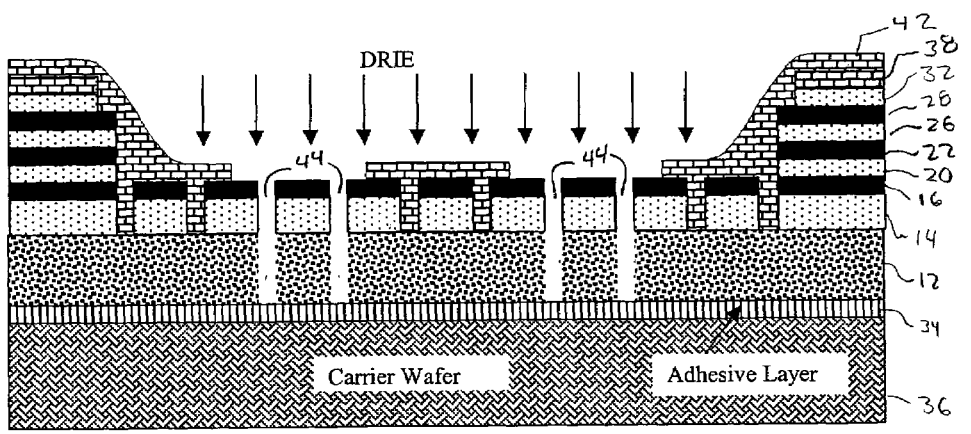
FIG. 7 illustrates the formation of pilot openings using a portion of the mesh as an etch mask.

FIG. 6 illustrates the substrate of FIG. 5 after the top side has been patterned with a layer of resist 42 to enable certain portions of the mesh 18 to act as an etch mask for pilot openings to be formed in the substrate 12. FIG. 7 illustrates the substrate 12 of FIG. 6 being subjected to a DRIE anisotropic etch which forms pilot openings 44 extending through the silicon substrate 12 and stopping at the layer of adhesive 34.

Figure 8:
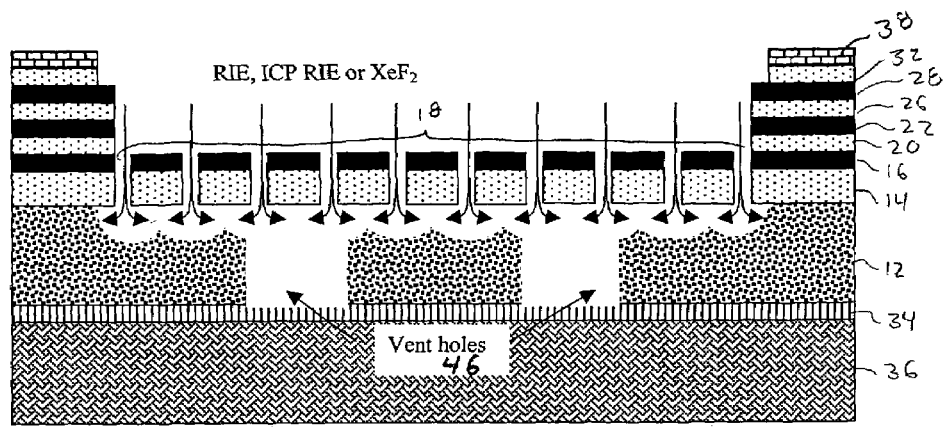
FIG. 8 illustrates the substrate of FIG. 7 after the mesh has been released and the pilot openings expanded to form vent holes.

FIG. 8 illustrates the substrate 12 being subjected to an isotropic etch so as to release the mesh 18 from the substrate 12 by removal of the substrate material from under the mesh 18. Other forms of releasing the mesh could be provided, such as removal of a sacrificial layer (not shown). As the mesh 18 is being released, the pilot openings 44 are being expanded to form vent holes 46. Because the vent holes 46 are formed by enlarging the pilot openings 44, and the pilot openings 44 are formed by using a portion of the mesh 18 as an etch mask, the vent openings 46 will be in alignment under the released mesh 18.

Figure 9:
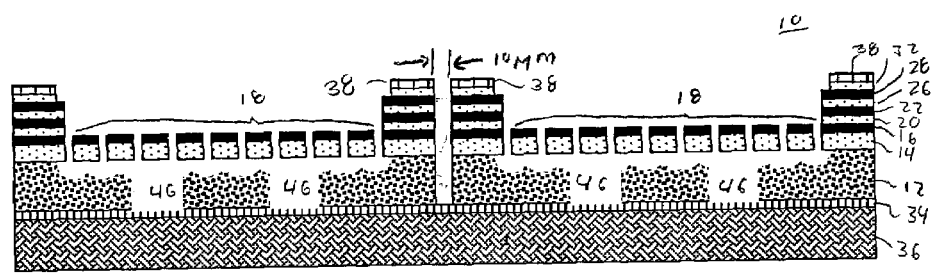
FIG. 9 illustrates how a plurality of devices may be singulated by etching either as a separate step or in conjunction with a through-wafer vent hole etch process.

FIG. 9 illustrates a larger portion of the wafer 10 such that two adjacent devices carried by substrate 12 are illustrated. FIG. 9 illustrates how a plurality of devices may be singulated by etching. The etching may be performed either as a separate step or in conjunction with the step of releasing the mesh 18 and/or forming vent holes 46 as illustrated in FIG. 8. In FIG. 9, it is seen that adjacent devices are laid out with a gap of approximately 10 $\mu$m between adjacent devices, although the gap can be varied by design, from a couple of microns to a couple of hundred microns. The layer of resist 38 is patterned such that while the mesh 18 is being released and the vent holes 46 are being formed, adjacent devices are being singulated. Alternatively, this singulation process could be performed separately, assuming an appropriate layer of resist was formed and patterned. However, because the releasing of the mesh 18 and formation of vent holes 46 is a through-wafer etch process, the singulation of the devices into separate chips can be completed at the same time. Thereafter, the adhesive layer can be de-adhered by heat, UV light or other means enabling each device (chip) to be picked up individually and packaged.

Figure 10:
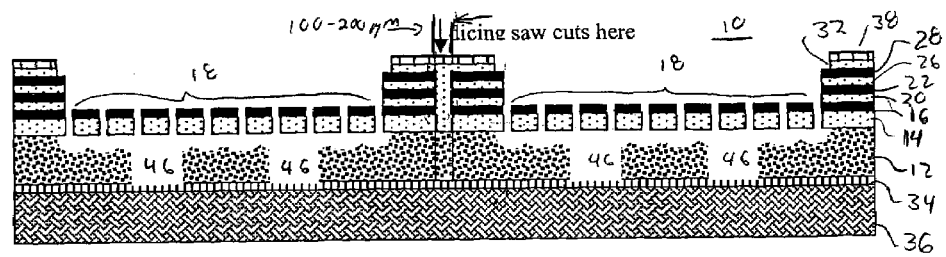
FIG. 10 illustrates how a plurality of devices may be singulated using conventional dicing.

FIG. 10 illustrates how the wafer 10 may be singulated using a dicing saw as is known in the art. Because the dicing saw provides a cut of a approximately 65 $\mu$m, adjacent devices will likely be laid out with a spacing of 100–200 $\mu$m between adjacent devices. Such a spacing allows for dicing saws of different thicknesses to be used while ensuring that the devices are not harmed. After dicing with a dicing saw, the adhesive layer can be de-adhered thus leaving the individual chips to be picked up and packaged.

Figure 11:
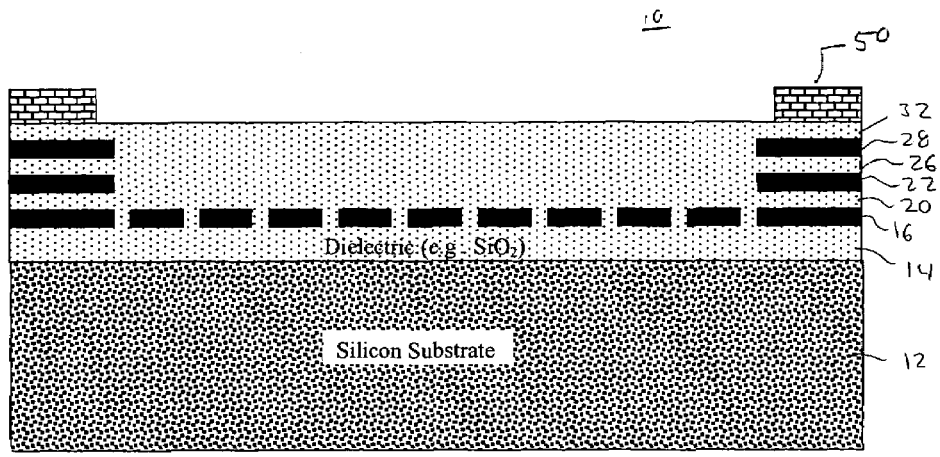
FIG. 11 illustrates the substrate of FIG. 1 after the top side has been patterned with a resist.

FIGS. 11–18 illustrate another embodiment of the present disclosure. The embodiment of FIGS. 11–18 is similar to the first embodiment, except that the thinning of the wafer 10 occurs at a different point in the process. The process of FIGS. 11–18 begins with a wafer 10 of the type shown in FIG. 1. FIG. 11 illustrates the wafer 10 of FIG. 1 after the top side has been patterned with a resist 50.

Figure 12:
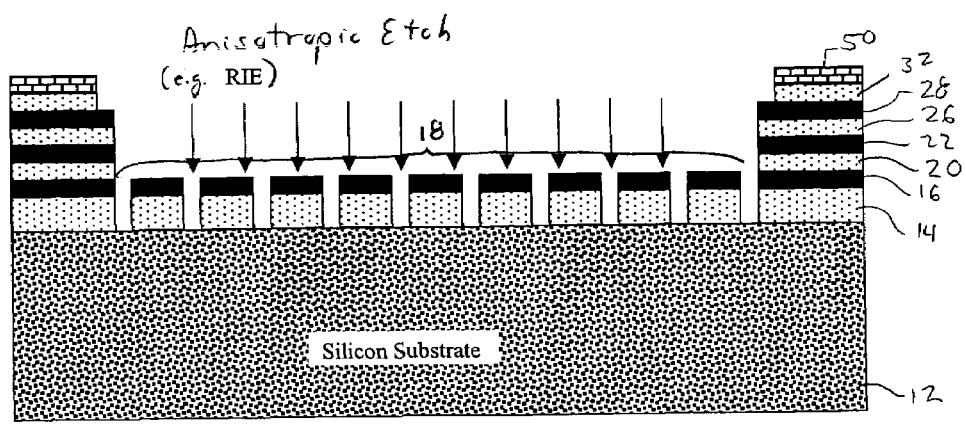
FIG. 12 illustrates the fabrication of the mesh as a result of an anisotropic etch.
Figure 13:
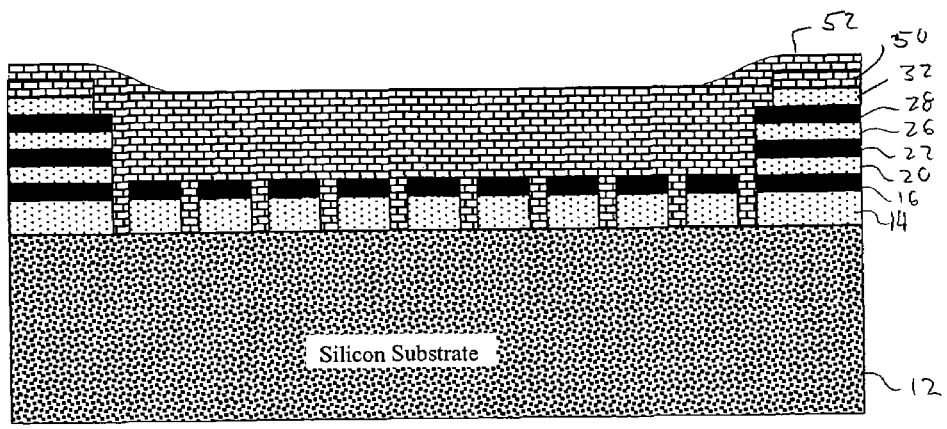
FIG. 13 illustrates the substrate of FIG. 12 after the top side has been covered with a protective layer.

Turning to FIG. 12, the substrate 12 of FIG. 11 is illustrated being subjected to an anisotropic etch through the dielectric layers 32, 26, 20 and 14. The patterned resist 50 and the first metal layer 16 are used to pattern the first dielectric layer 14 and to form mesh 18. The layer of resist 50 may not be necessary if it is not necessary to protect the top layer of dielectric 32. In FIG. 13, a protective layer of resist 52 is formed on the top side of wafer 10.

Figure 14:
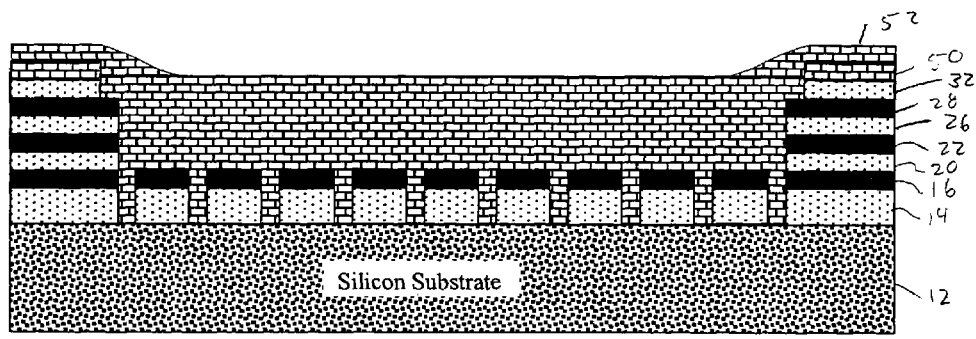
FIG. 14 illustrates the substrate of FIG. 13 after the thickness of the substrate has been reduced.
Figure 15:
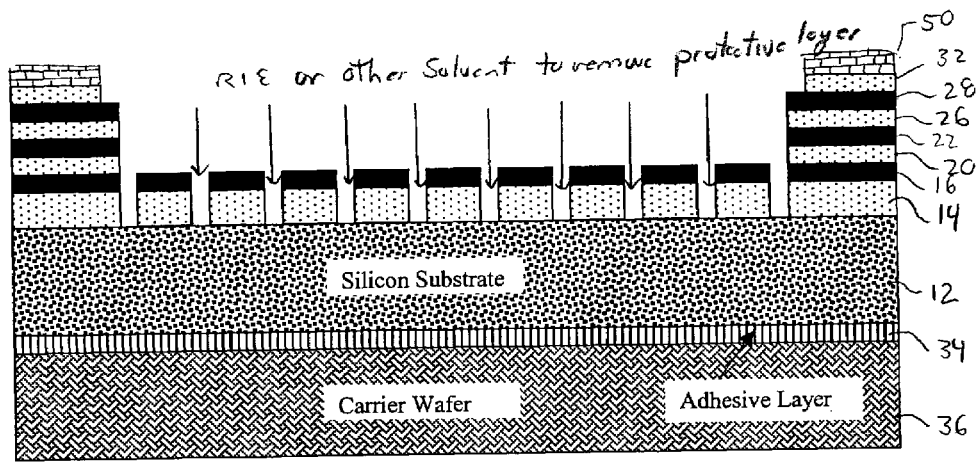
FIG. 15 illustrates the substrate of FIG. 14 after a carrier wafer has been attached to the back side of the substrate and the protective layer has been removed from the top side of the substrate.

In FIG. 14, a CMP process, back side grinding, RIE, DRIE or other process is performed on the back side of the wafer 10 to thin the wafer to 50–100 $\mu$m. In FIG. 15, a layer of adhesive 34 is used to attach the first carrier wafer 36 to the back side of the substrate 14. Openings (not shown) may be provided in the first carrier wafer 36 and/or adhesive layer 34 to provide for cooling of the substrate 12. Additionally, those of ordinary skill in the art will recognize that, depending on the amount of substrate 14 being removed and the process being performed, it may be necessary to attach a temporary carrier wafer (not shown) to the top side of wafer 10 to provide support for the thinning process. If such a temporary support is needed, it is removed after first carrier wafer 36 is attached as shown in FIG. 15.

Figure 16:
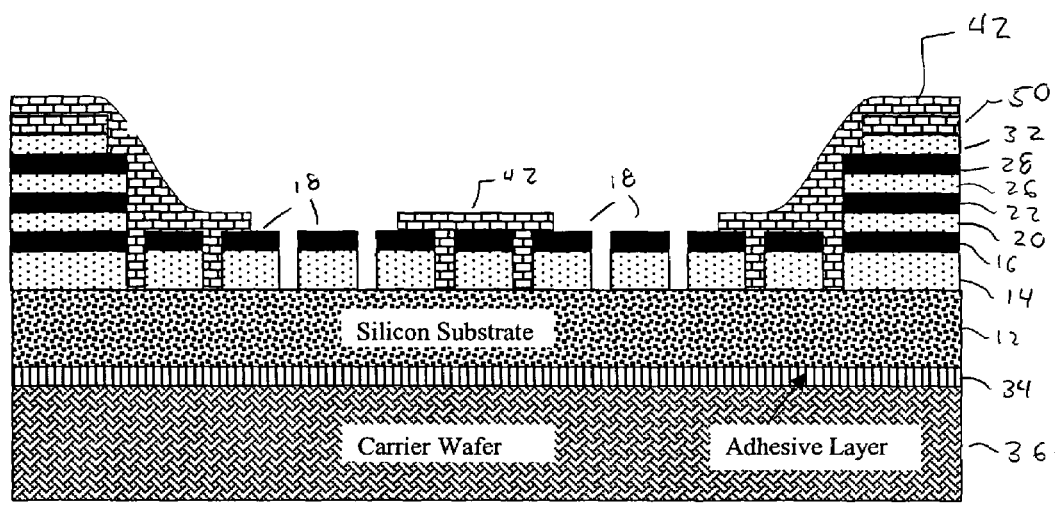
FIG. 16 illustrates the substrate of FIG. 15 after a layer of resist has been deposited and patterned to enable certain portions of the mesh to act as an etch mask for pilot openings to be formed in the substrate.
Figure 17:
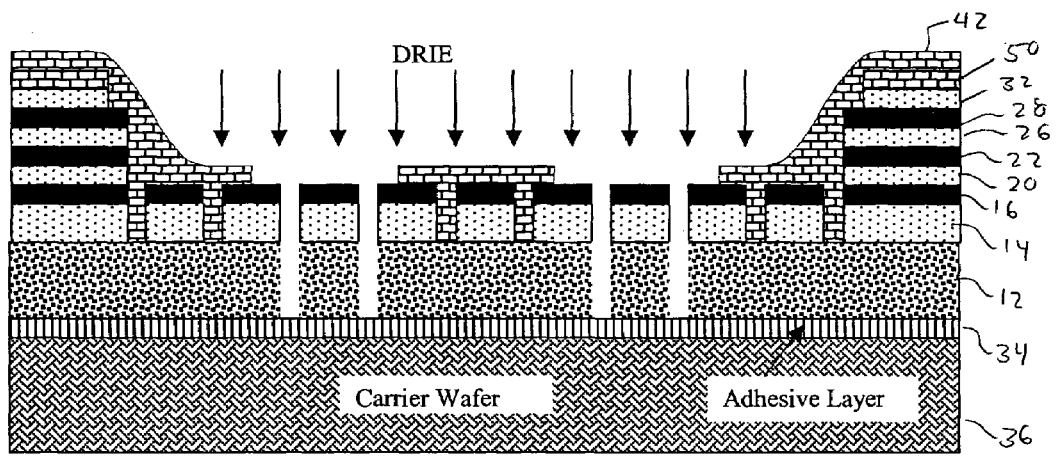
FIG. 17 illustrates the substrate of FIG. 16 after pilot openings have been formed as a result of an anisotropic etch.
Figure 18:
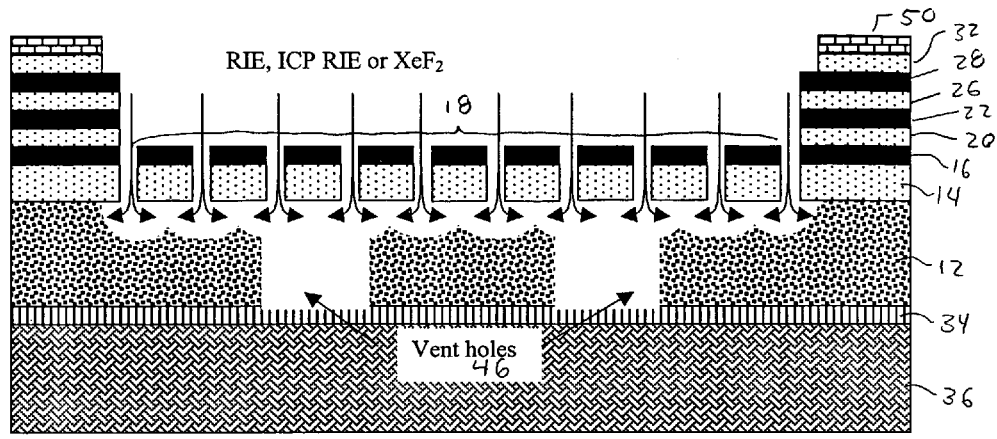
FIG. 18 illustrates the substrate of FIG. 17 after the mesh has been released and the pilot openings expanded to form vent holes.

The process continues as shown in FIGS. 16–18 which are the same as FIGS. 6–8, respectively. Thereafter, singulation may be performed using either the method of FIG. 9 or FIG. 10.

Figure 19:
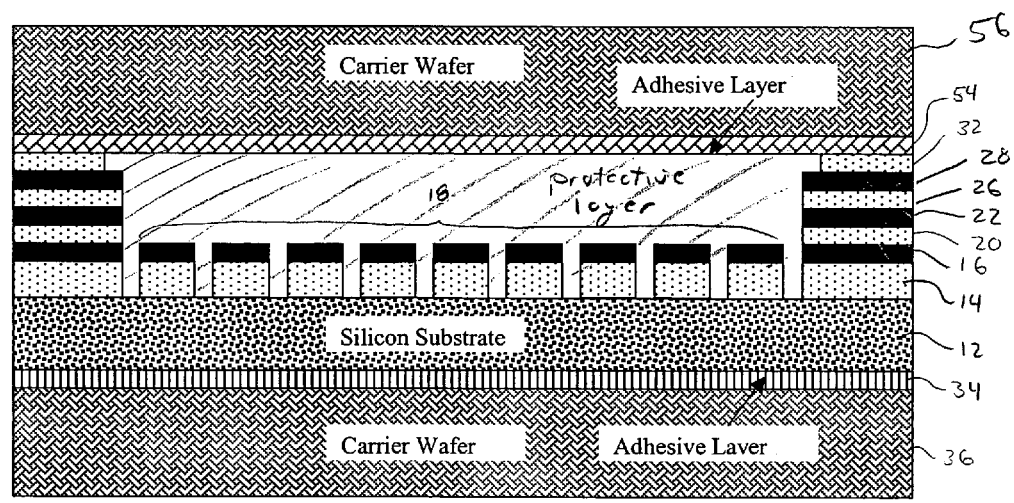
FIG. 19 illustrates the substrate of FIG. 5 after a second carrier wafer has been attached to the top side of the substrate; a protective material may fill gaps between carrier wafer and substrate.
Figure 20:
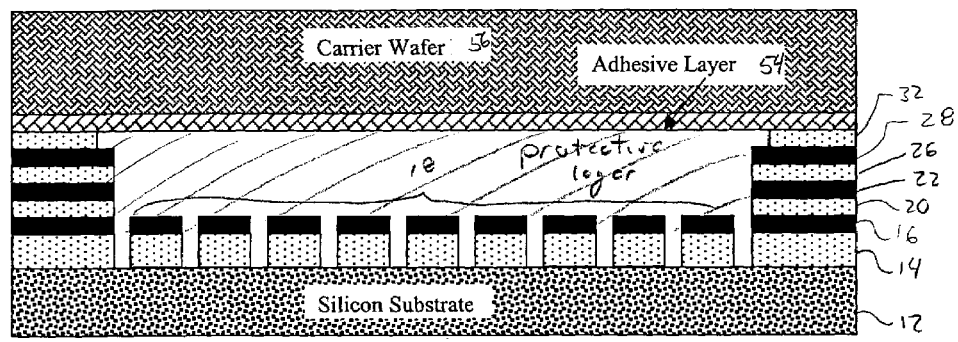
FIG. 20 illustrates the substrate of FIG. 19 after the first carrier wafer has been removed from the back side of the substrate.

Another embodiment is illustrated in conjunction with FIGS. 1–5 and 19–25. In this embodiment, the process as discussed in conjunction with FIGS. 1–5 is carried out as discussed above. However, upon forming the mesh 18 as shown in FIG. 5, the process continues as shown in FIG. 19. In FIG. 19, the wafer 10 is bonded via a layer of adhesive 54 to a second carrier wafer 56 on the top side of the wafer 10. The resist 38 illustrated in FIG. 5 may or may not be removed before the bonding step. Thereafter, as shown in FIG. 20, the first carrier wafer 36 is detached from the wafer 10 using any method appropriating for de-adhering layer 34.

Figure 21:
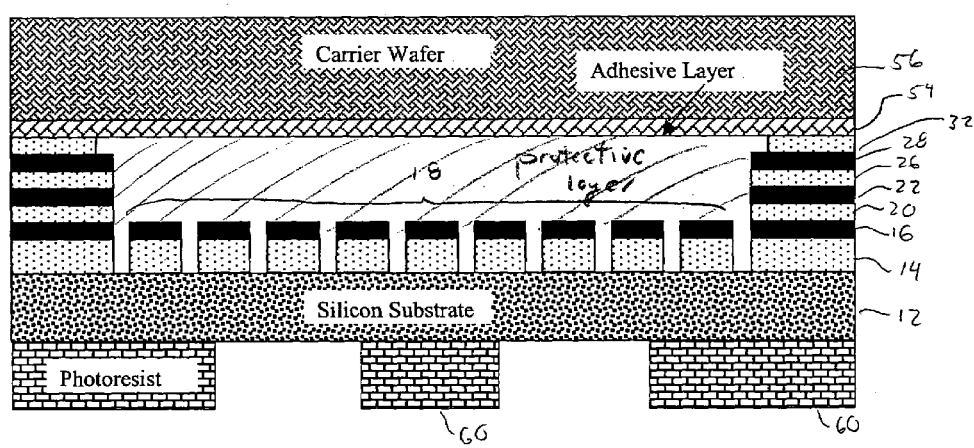
FIG. 21 illustrates the substrate of FIG. 20 after a layer of resist has been deposited and patterned on the back side of the substrate.
Figure 22:
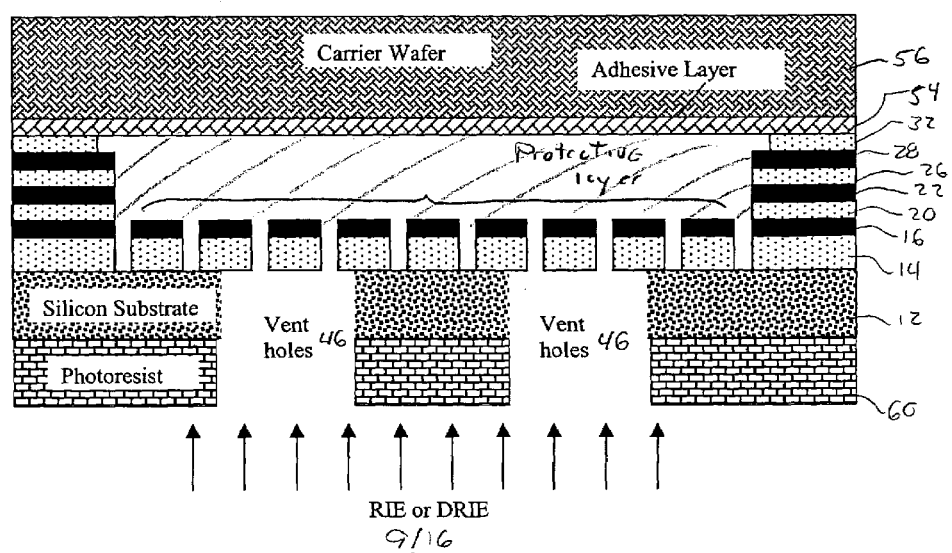
FIG. 22 illustrates the substrate of FIG. 21 after the formation of vent holes.

Turning now to FIG. 21, a layer of resist 60 is formed and patterned to provide openings for fabrication of the vent holes. Those of ordinary skill in the art will realize that landmarks from the top side of the wafer 10 need to be transferred to the back side to provide landmarks for registration of the mask needed to pattern the layer of resist 60. Transferring such landmarks is known in the art and therefore not described herein. After the layer of resist 60 has been patterned, the wafer 10 is subjected RIE or DRIE as shown in FIG. 22 to fabricate vent holes 46.

Figure 23:
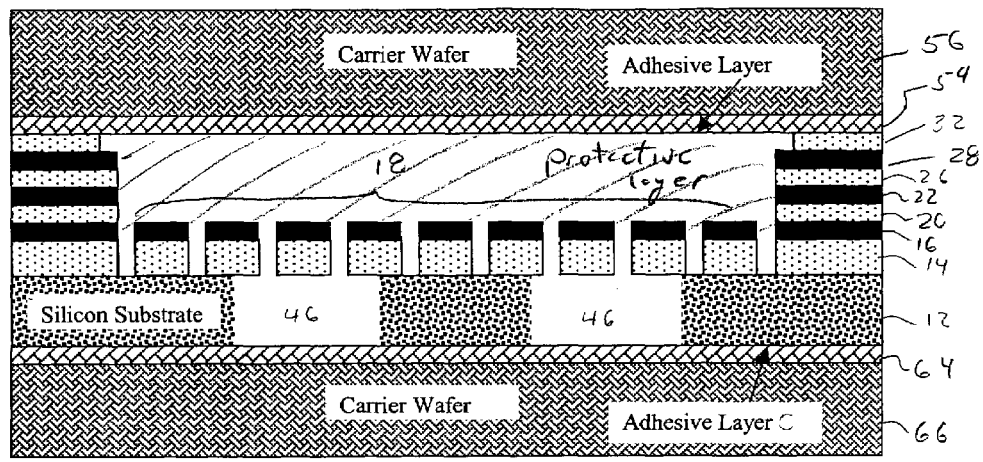
FIG. 23 illustrates the substrate of FIG. 22 after the attachment of a third carrier wafer to the back side of the substrate.
Figure 24:
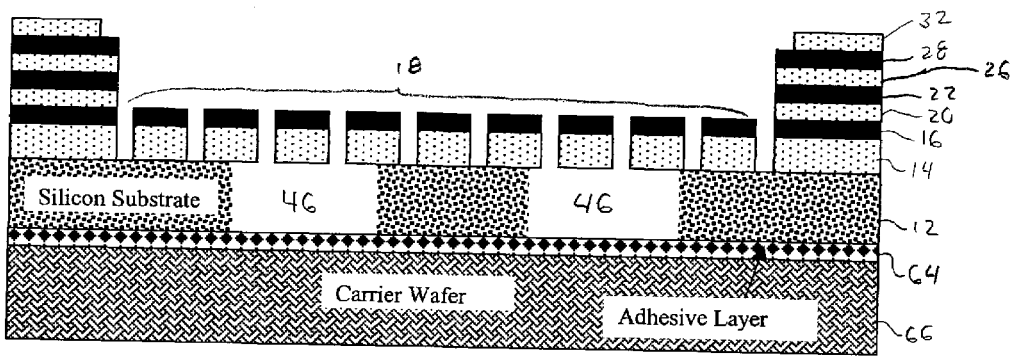
FIG. 24 illustrates the substrate of FIG. 23 after the second carrier has been removed from the top side of the substrate; the protective layer has also been removed.
Figure 25:
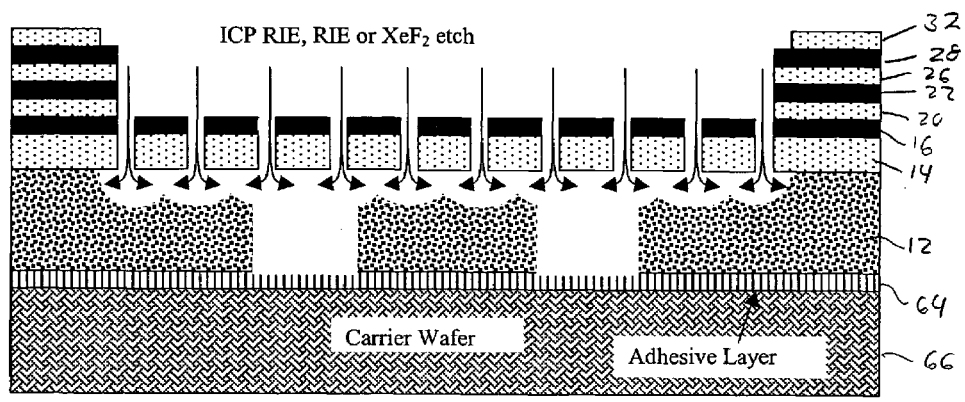
FIG. 25 illustrates the substrate of FIG. 24 after the mesh has been released.

In FIG. 23, the wafer 10 is bonded to a third carrier wafer 66 with a layer of adhesive 64. The resist from the previous step may be removed by any appropriate means, such as oxygen plasma cleaning. The second carrier wafer 56 is detached from the wafer 10 by de-adhering the layer of adhesive 54 resulting in the structure illustrated in FIG. 24. Any protective layers that have been provided can be removed by appropriate methods. An isotropic etch of the silicon substrate 12 is performed to release the mesh 18 from the substrate and to further enlarge the vent holes 46. Thereafter, singulation may be performed as discussed above with either FIG. 9 or 10.

Figure 26:
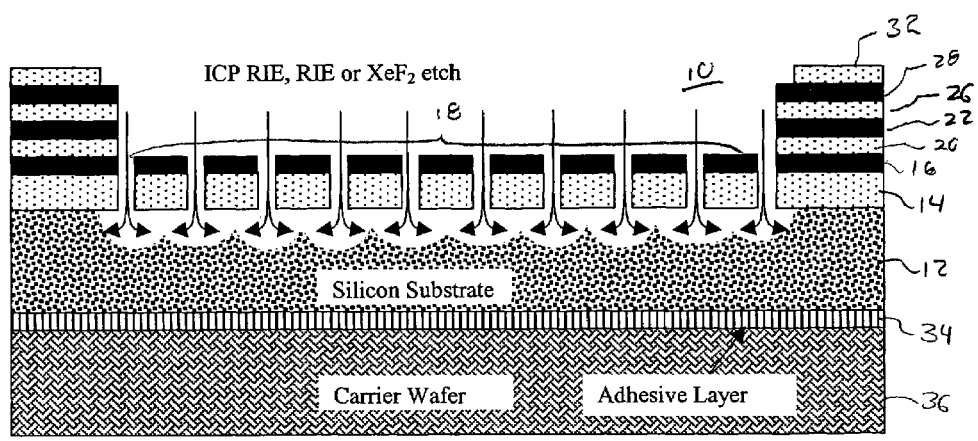
FIG. 26 illustrates the substrate of FIG. 5 after an isotropic etch has been performed to release the mesh.
Figure 27:
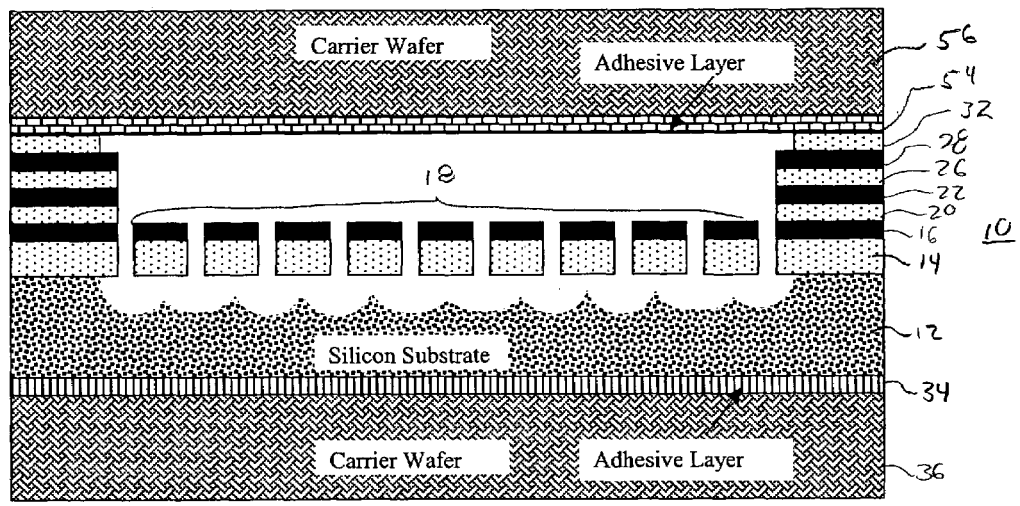
FIG. 27 illustrates the substrate of FIG. 26 after a second carrier wafer has been attached to the top side of the substrate.

Another embodiment is illustrated in conjunction with FIGS. 1–5 and 26–30. In this embodiment, the process as discussed above in conjunction with FIGS. 1–5 is carried out as discussed above. However, in this embodiment, the mesh 18 is released as shown in FIG. 26 by, for example, an isotropic etch of the silicon substrate 12. The wafer 10 is bonded to the second carrier wafer 56 through the use of a layer of adhesive 54 on the top side of the wafer 10 as illustrated in FIG. 27.

Figure 28:
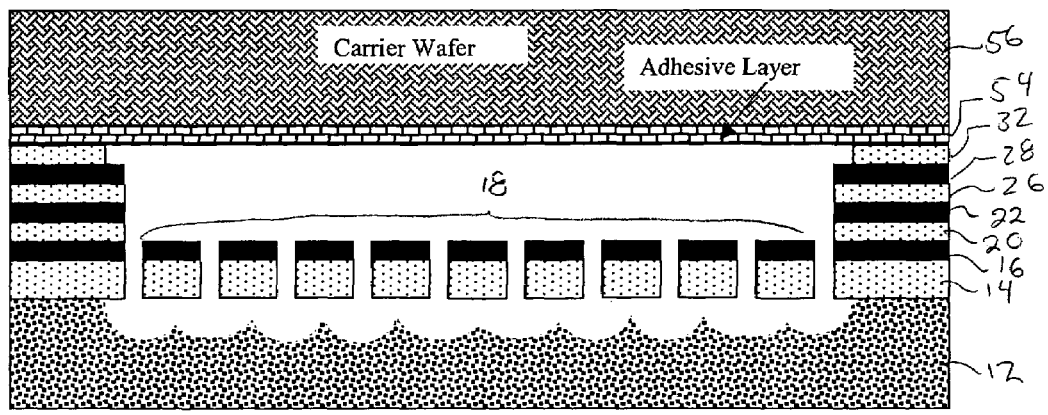
FIG. 28 illustrates the substrate of FIG. 27 after the first carrier wafer has been removed from the back side of the substrate.
Figure 29:
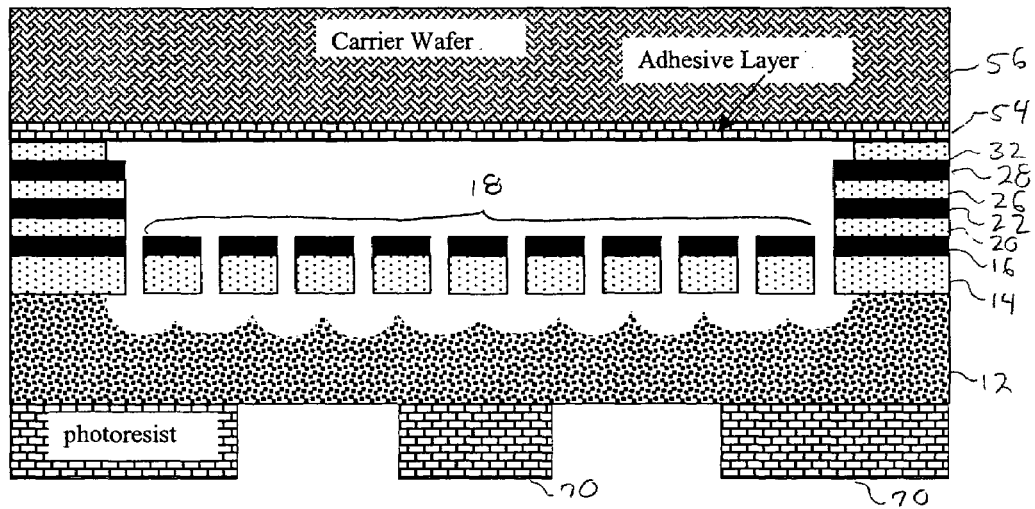
FIG. 29 illustrates the substrate of FIG. 28 after a layer of resist has been patterned.
Figure 30:
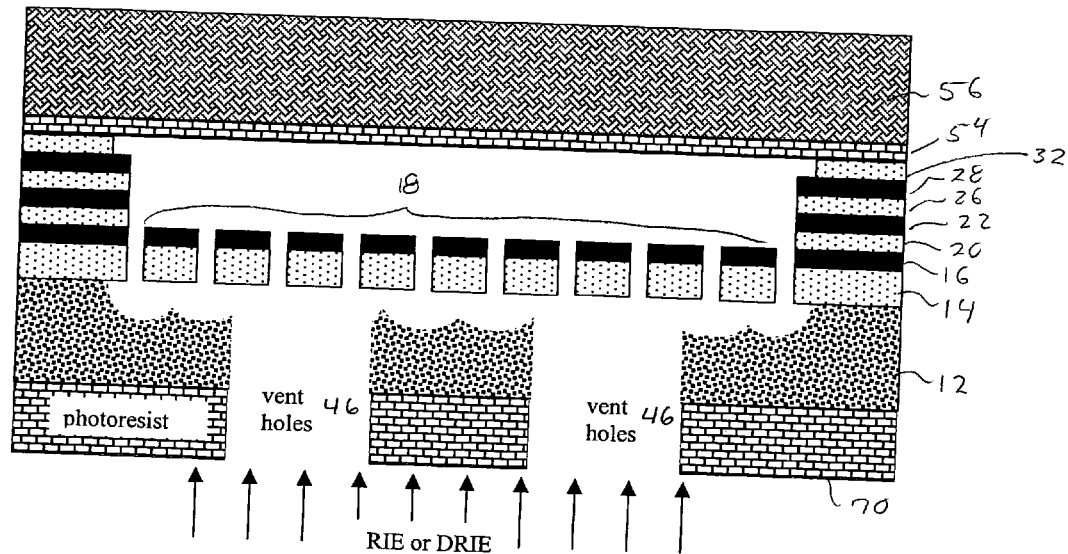
FIG. 30 illustrates the substrate of FIG. 29 after an etch has been performed to form vent holes.
Figure 31:
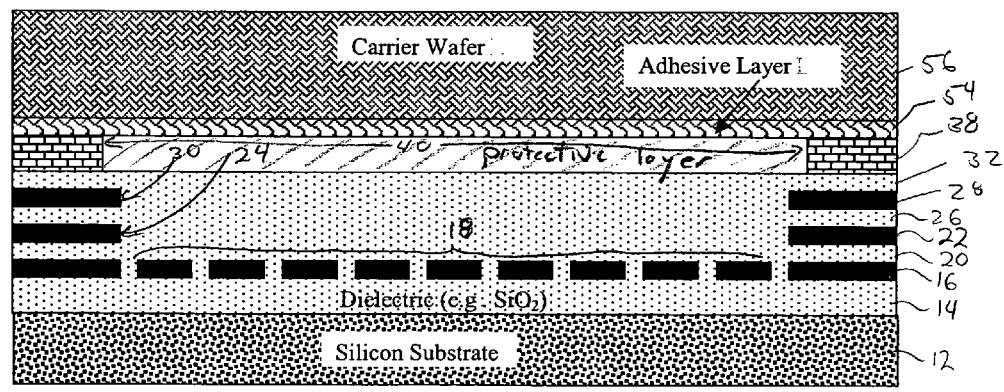
FIG. 31 illustrates the substrate of FIG. 4 after the attachment of a second carrier wafer to the top side of the substrate and the removal of the first carrier wafer from the back side of the substrate; a protective layer may fill gaps between carrier wafer and substrate.

Turning now to FIG. 28, the first carrier wafer 36 is detached from the wafer 10 by de-adhering adhesive layer 34. In FIG. 29, a layer of resist 70 has been formed and patterned on the back side of the wafer 10 to provide for fabrication of the vent holes. In FIG. 30, an RIE or DRIE process is performed to fabricate the vent holes 46. The resist 70 may be stripped off at the end of the etch. Because this is a through wafer etch process, singulation of the chips can be completed at the same time as the vent holes 46 are fabricated as discussed above in conjunction with FIG. 9. Alternatively, singulation may be performed using a dicing saw as discussed above in conjunction with FIG. 10.

Another embodiment is illustrated in conjunction with FIGS. 1–4 and 31–38. In this embodiment, the process as discussed above in conjunction with FIGS. 1–4 is carried out as discussed above. After the wafer 10 has been processed as shown in FIG. 4, the wafer 10 is bonded to the second carrier wafer 56, using a layer of resist 54 and the first carrier wafer 36 is removed by de-adhering the layer of adhesive 34 resulting in the structure illustrated in FIG. 31.

Figure 32:
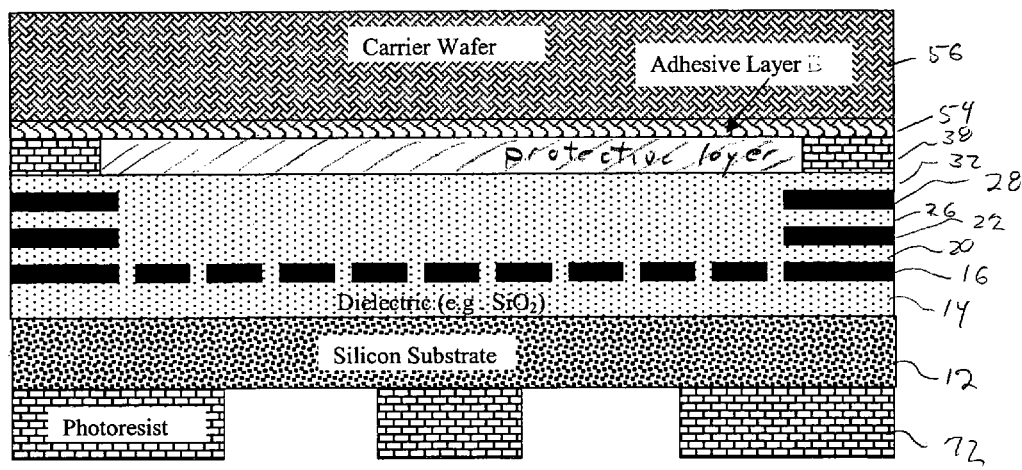
FIG. 32 illustrates the substrate of FIG. 31 after a layer of resist has been patterned on the back side of the substrate.
Figure 33:
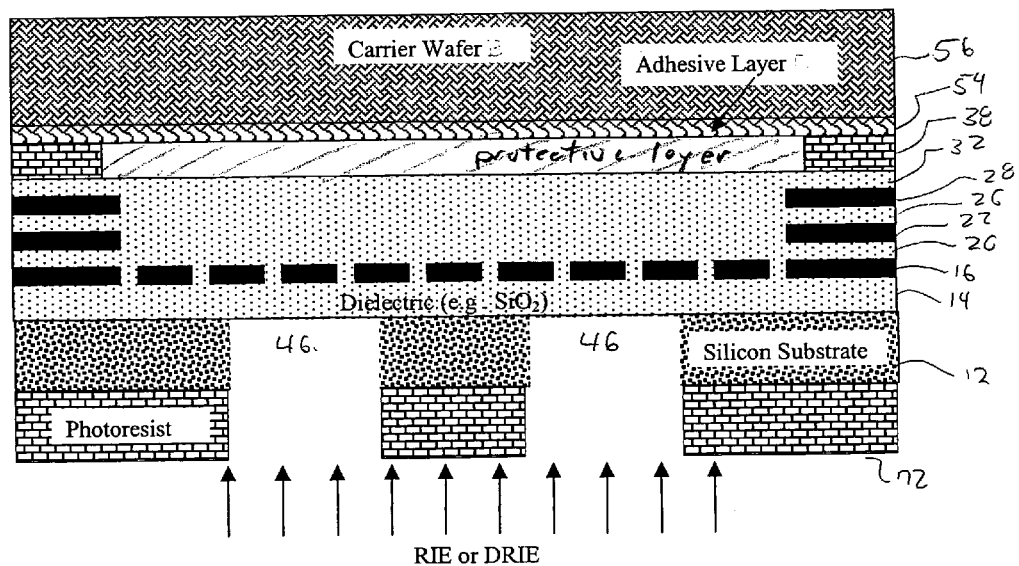
FIG. 33 illustrates the substrate of FIG. 32 after the formation of vent holes.
Figure 34:
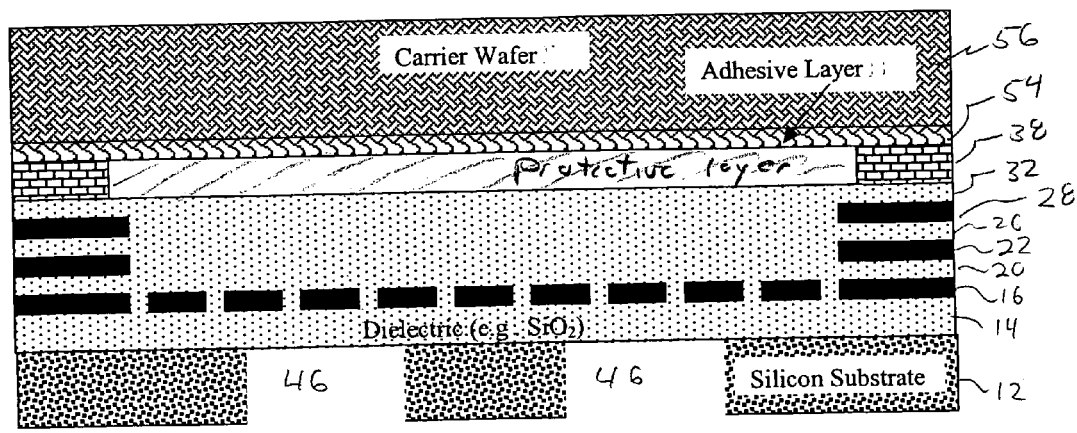
FIG. 34 illustrates the substrate of FIG. 33 with the remaining resist removed.

In FIG. 32, the back side of the wafer 10 has a layer of resist 72 formed and patterned as shown in the figure. An RIE or DRIE is performed as shown in FIG. 33 to fabricate the vent holes 46. The resist 72 on the back side of the wafer is then removed as shown in FIG. 34.

Figure 35:
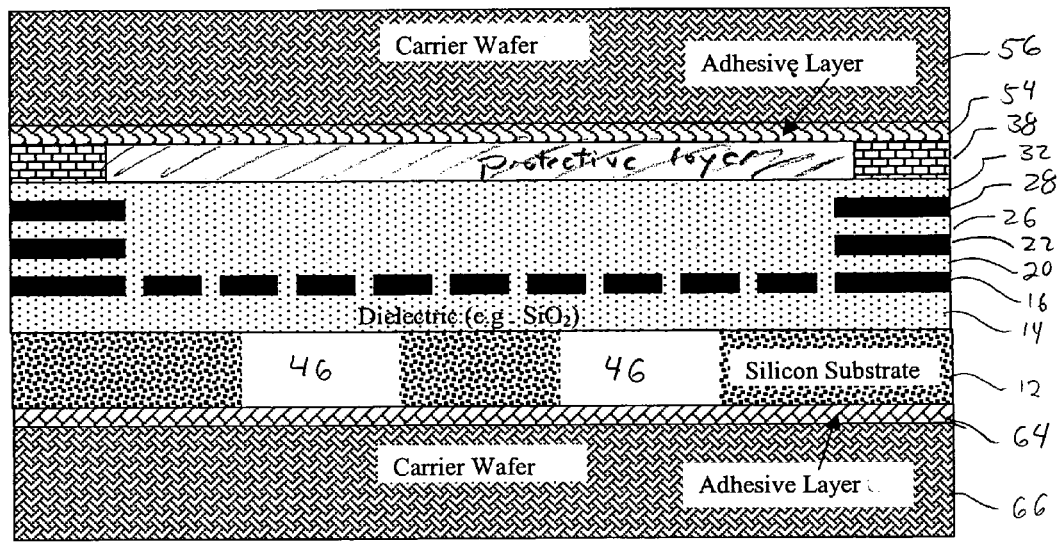
FIG. 35 illustrates the substrate of FIG. 34 after the attachment of a third carrier wafer to the back side of the substrate.
Figure 36:
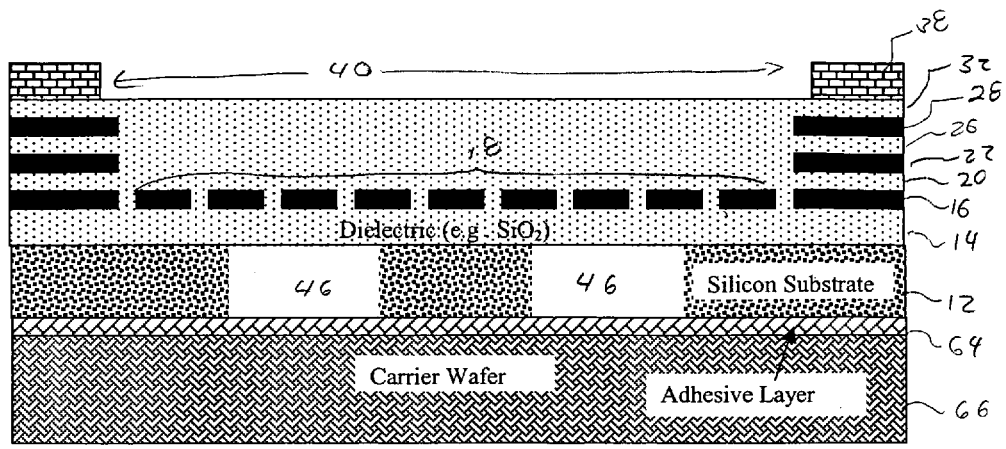
FIG. 36 illustrates the substrate of FIG. 35 after the removal of the second carrier wafer from the top side of the substrate.
Figure 37:
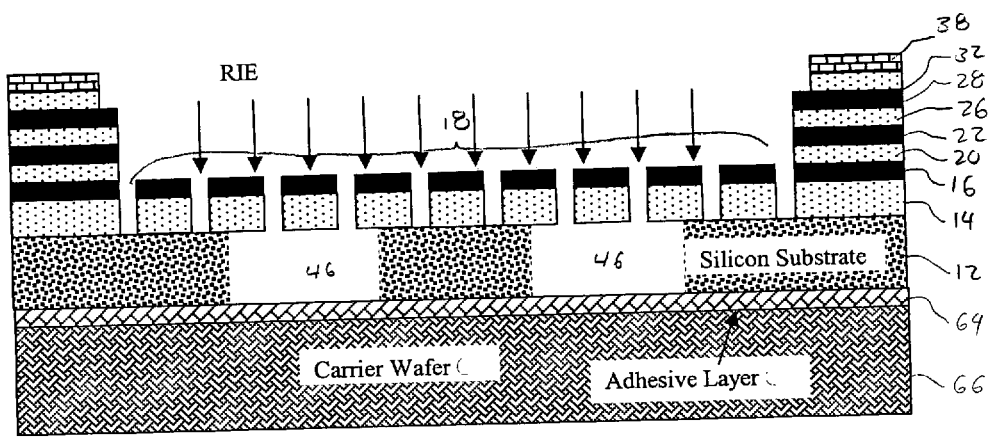
FIG. 37 illustrates the fabrication of the mesh as a result of an anisotropic etch.
Figure 38:
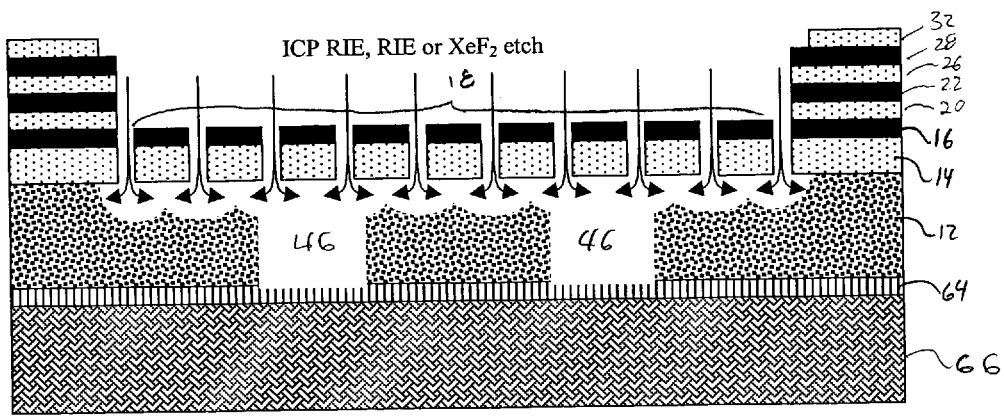
FIG. 38 illustrates the substrate of FIG. 37 after the mesh is released.

Turning now to FIG. 35, the third carrier wafer 66 is bonded to the back side of wafer 10 with a layer of adhesive 64. In FIG. 36, the second carrier wafer 56 is removed from the wafer 10 by de-adhering the layer of adhesive 54. In FIG. 37, an isotropic etch through the dielectric layers 32, 26, 20 and 14 is performed to form the mesh 18. In FIG. 38, an isotropic etch of the silicon substrate 12 is performed to release the mesh 18 and to enlarge the vent holes 46. Because this is a through-wafer etch process, the separation of the chips can be completed at the same time as discussed above in conjunction with FIG. 9. Alternatively, because of the carrier wafer, singulation can be performed before the device is completely fabricated by taking advantage of any through-wafer etch processes. For example, singulation could occur along with the etching of the substrate shown in FIG. 34. As another alternative, the wafer 10 can be diced with a dicing saw as discussed above in conjunction with FIG. 10.

Completing the process, the mesh 18 of any of the embodiments may be sealed using known deposition techniques to form a membrane capable of operating as a speaker or a microphone.

This disclosure describes a simplified process for making vent holes while eliminating the need for acoustic cavities in each chip for a CMOS MEMS based microphone or microspeaker. Certain of the disclosed embodiments are performed entirely from the top side of the wafer thereby eliminating the need for back side alignment of vent holes relative to the mesh. By reducing the wafer thickness to a specified thickness with standard processes, which are capable of achieving well controlled uniformity across the wafer, the length of the vent holes can be well defined. Therefore, the etch time of a vent hole can be well defined and optimized. Moreover, instead of using special and expensive techniques to etch deep, narrow vent holes, standard RIE techniques can be used to etch the vent holes. This allows for the post-CMOS production to be transferred into a standard CMOS foundry. By integrating chip dicing with the post-CMOS process, manufacturing costs associated with the dicing and separation process can be reduced. By integrating chip dicing with the post-CMOS process, the extra chip size required for dicing with traditional dicing saws may be eliminated.

While the present disclosure has been described in connection with preferred embodiments thereof, those of ordinary skill in the art will recognize that many modifications and variations are possible. The present disclosure is intended to be limited only by the following claims and not by the foregoing description which is intended to set forth the presently preferred embodiments.

What is claimed is:

1. A process, comprising:
   reducing the thickness of a substrate carrying a plurality of devices, at least certain of the devices having a micromachined mesh;
   attaching a carrier wafer to the back side of the substrate;
   completing the fabrication of the devices from the top side of the substrate, said completing comprising forming certain of said meshes; and
   singulating said plurality of devices.

2. The process of claim 1 wherein said completing comprises:
   releasing at least certain of the formed meshes; and
   fabricating vent holes that connect through the substrate in at least certain of the areas where the released meshes are located.

3. The process of claim 2 wherein said singulating said plurality of devices is performed substantially simultaneously with said releasing.

4. The process of claim 3 additionally comprising removing said carrier wafer.

5. The process of claim 2 wherein said singulating said plurality of devices is performed substantially simultaneously with said fabricating.

6. The process of claim 5 additionally comprising removing said carrier wafer.

7. The process of claim 2 wherein said fabricating is performed after said releasing.

8. The process of claim 2 wherein said fabricating is performed simultaneously with said releasing.

9. The process of claim 2 wherein said fabricating comprises using said formed mesh as an etch mask.

10. The process of claim 1 wherein said completing comprises:
    forming pilot openings in said substrate by using at least portions of certain of said formed meshes as an etch mask;
    releasing at least certain of said formed meshes by removing a portion of substrate beneath the meshes; and
    fabricating vent holes substantially simultaneously with said releasing by enlarging said pilot openings.

11. The process of claim 10 wherein an anisotropic etch is used to form said pilot openings and an isotropic etch is used for releasing the meshes and fabricating the vent holes.

12. A process, comprising:
    reducing the thickness of a substrate carrying a plurality of devices, at least certain of the devices having a mesh;
    attaching a first carrier wafer to the back side of the substrate;
    forming and releasing a mesh;
    attaching a second carrier wafer to the top side of the substrate and removing said first carrier wafer from the back side of the substrate;
    fabricating vent holes from the back of the substrate; and
    singulating said devices.

13. The process of claim 12 wherein said singulating is performed substantially simultaneously with said forming.

14. The process of claim 13 additionally comprising removing said second carrier wafer after said singulating.

15. The process of claim 12 wherein said singulating comprises dicing the substrate.

16. The process of claim 15 additionally comprising removing said second carrier wafer after said dicing.

17. A process, comprising:
reducing the thickness of a substrate carrying a plurality of devices, at least certain of the devices having a mesh;
attaching a first carrier wafer to the back side of the substrate;
forming a mesh;
attaching a second carrier wafer to the top side of the substrate and removing said first carrier wafer from the back side of the substrate;
fabricating vent holes from the back of the substrate;
attaching a third carrier wafer to the back side of the substrate and removing the second carrier from the top side of the substrate;
releasing the mesh; and
singulating said devices.

18. The process of claim 17 wherein said singulating is performed substantially simultaneously with said releasing.

19. The process of claim 18 additionally comprising removing said third carrier wafer after said singulating.

20. The process of claim 17 wherein said singulating comprises dicing the substrate.

21. The process of claim 20 additionally comprising removing said third carrier wafer after said dicing.

22. A process, comprising:
reducing the thickness of a substrate carrying a plurality of devices, at least certain of the devices having a mesh;
attaching a first carrier wafer to the back side of the substrate;
patterning a resist to define a mesh;
attaching a second carrier wafer to the top side of the substrate and removing said first carrier wafer from the back side of the substrate;
fabricating vent holes from the back of the substrate;
attaching a third carrier wafer to the back side of the substrate and removing the second carrier from the top side of the substrate;
forming and releasing the mesh; and
singulating said devices.

23. The process of claim 22 wherein said singulating is performed substantially simultaneously with said releasing.

24. The process of claim 23 additionally comprising removing said third carrier wafer after said singulating.

25. The process of claim 22 wherein said singulating comprises dicing the substrate.

26. The process of claim 25 additionally comprising removing said third carrier wafer after said dicing.

27. In a process for fabricating a MEMS device, the improvement comprising:
reducing the thickness of a substrate carrying a plurality of devices, at least certain of said devices having a micromachined mesh; and
attaching a carrier wafer to the back side of the substrate for at least a part of the process of fabricating the MEMS device including forming certain of said meshes.

28. In a process for fabrication a MEMS device, the improvement comprising:
reducing the thickness of a substrate; and
attaching a carrier wafer to a back side of the substrate to enable process steps to be performed from the top side of the substrate; and
attaching a carrier wafer to the top side of the substrate and removing the carrier wafer from the back side of the substrate to enable process steps to be performed from the back side of the substrate.

* * * * *

UNITED STATES PATENT AND TRADEMARK OFFICE
CERTIFICATE OF CORRECTION

PATENT NO.       : 6,936,524 B2
APPLICATION NO.  : 10/701860
DATED            : August 30, 2005
INVENTOR(S)      : Xu Zhu et al.

It is certified that error appears in the above-identified patent and that said Letters Patent is hereby corrected as shown below:

On the Title page of the patent Item [56] under the heading "OTHER PUBLICATIONS," please cancel "Kaigham H. Gabriel" and substitute therefor --Kaigham J. Gabriel--.

Column 6, Line 48, after "subjected" insert --to--.

Signed and Sealed this

Fifteenth Day of May, 2007

JON W. DUDAS
*Director of the United States Patent and Trademark Office*